(12) United States Patent
McBurney

(10) Patent No.: US 6,714,160 B2
(45) Date of Patent: Mar. 30, 2004

(54) REAL TIME CLOCK FOR GPS RECEIVERS

(75) Inventor: Paul W. McBurney, San Francisco, CA (US)

(73) Assignees: eRide, Inc., San Francisco, CA (US); Seiko Epson Corporation, Tokyo (JP)

(*) Notice: Subject to any disclaimer, the term of this patent is extended or adjusted under 35 U.S.C. 154(b) by 0 days.

(21) Appl. No.: 10/079,253

(22) Filed: Feb. 19, 2002

(65) Prior Publication Data

US 2003/0164795 A1 Sep. 4, 2003

(51) Int. Cl.[7] .............................................. G01C 21/00
(52) U.S. Cl. ............................ 342/357.15; 342/357.06
(58) Field of Search ..................... 342/357.15, 357.12, 342/357.06, 357.02

(56) References Cited

U.S. PATENT DOCUMENTS

| | | | |
|---|---|---|---|
| 5,594,453 A | * 1/1997 | Rodal et al. | 342/357.15 |
| 5,629,708 A | 5/1997 | Rodal et al. | 342/357.15 |
| 5,654,718 A | * 8/1997 | Beason et al. | 342/357.15 |
| 5,854,605 A | 12/1998 | Gildea | 342/357.03 |
| 5,893,044 A | * 4/1999 | King et al. | 701/214 |
| 5,940,027 A | 8/1999 | Forseth et al. | 342/357.06 |

* cited by examiner

*Primary Examiner*—Gregory C. Issing

(57) ABSTRACT

A navigation-satellite receiver comprises a real-time clock that can be slaved to the highly accurate time base of the GPS system. During such times, the amount of correction and the operating temperature are both tracked. It is assumed the operating temperature will has the greatest influence of frequency errors later when the real-time clock cannot be slaved to the GPS time base. When the receiver is powered-down, the real time clock is nevertheless kept alive. Its free-running frequency is corrected for temperature. The next time the receiver is powered up, time accurate to better than one millisecond in a day can be obtained instantly for use in other receiver initialization procedures.

4 Claims, 1 Drawing Sheet

REAL TIME CLOCK FOR GPS RECEIVERS

FIELD OF THE INVENTION

Figure 1:
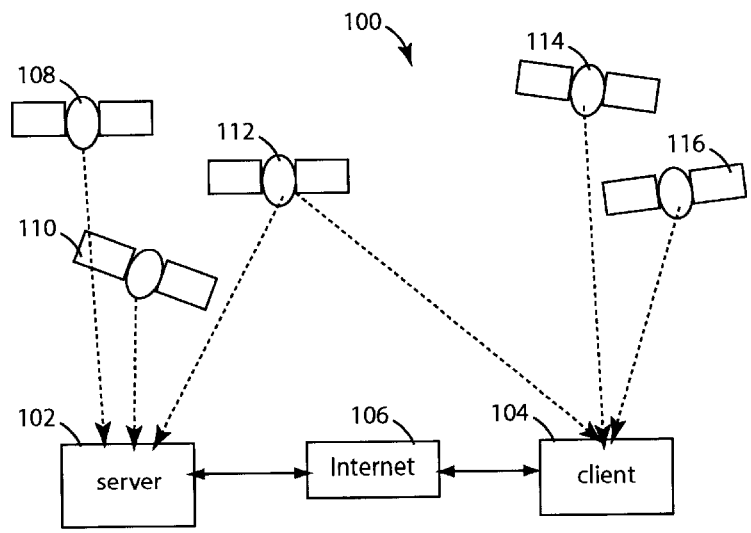

The present invention relates to navigation satellite receivers, and more particularly to methods and systems for improving the time-to-first-fix of navigation satellite receivers by reducing the time uncertainty of just-started receivers.

DESCRIPTION OF THE PRIOR ART

Global positioning system (GPS) receivers use signals received from several earth-orbiting satellites in a constellation to determine user position and velocity, and other navigational data. A prior art navigation receiver that has just been turned on does not yet know where it is, how much its crystal oscillator is in error, nor what time it is. All these are needed to find and lock onto the satellite transmissions, and so a search must be made of the possibilities. The most probable are searched first to save time.

High-sensitivity GPS receivers are a problem when the initial time or frequency uncertainty is large. Finding signal energy when the signal energy is extremely faint requires making smaller steps and dwelling at each step longer. So having a better initial estimate of the local reference oscillator can improve time-to-first-fix.

GPS receivers with signal levels better that −145 dbm can readily lock onto a strong GPS satellite vehicle (SV) to decode the NAV-data. Such yields the SV ephemeris and position. After than, the total pseudorange needs to be formed from the hardware codephase. Conventional GPS receivers determine the integer millisecond and so-called z-count.

When signal levels are roughly no better than −145 dbm to −150 dbm, a practical high-sensitivity GPS receiver can employ pattern-matching tricks to get a z-count or integer millisecond for an anywhere-fix.

GPS receivers that are locked onto and tracking one or more GPS satellite vehicles (SV's), know time to very high accuracy. This is because the GPS system is based on atomic clocks that set the time and frequency references used. The coarse acquisition (C/A) transmitted by the SV's repeats every one millisecond of propagation wavelength, and so there is a basic ambiguity as to which millisecond a GPS receiver is observing. If the integer millisecond is known, e.g., time is known to better than one millisecond, then the integer ambiguity does not need to be solved. The z-count is known. Skipping the steps to find z-count and set the integer millisecond can save a tremendous amount of time and effort in a GPS receiver working on providing its first navigation solution fix after a cold start.

SUMMARY OF THE INVENTION

It is therefore an object of the present invention to provide a real time clock for faster initialization of a navigation satellite receiver by keeping track of time after the unit is powered-down.

It is another object of the present invention to provide a method and system for shortening the time needed for initialization of navigation devices.

It is a further object of the present invention to provide a satellite-navigation system that is inexpensive.

Briefly, a navigation-satellite receiver embodiment of the present invention comprises a real-time clock that can be slaved to the highly accurate time base of the GPS system. During such times, the amount of correction and the operating temperature are both tracked. It is assumed the operating temperature will has the greatest influence of frequency errors later when the real-time clock cannot be slaved to the GPS time base. When the receiver is powered-down, the real time clock is nevertheless kept alive. Its free-running frequency is corrected for temperature. The next time the receiver is powered up, time accurate to better than one millisecond in a day can be obtained instantly for use in other receiver initialization procedures.

An advantage of the present invention is that a system and method are provided that produce faster initialization times in navigation satellite receivers.

Another advantage of the present invention is that a system and method are provided for avoiding the use of more difficult procedures and calculations in GPS receivers to find the z-count and integer millisecond.

These and other objects and advantages of the present invention will no doubt become obvious to those of ordinary skill in the art after having read the following detailed description of the preferred embodiments which are illustrated in the various drawing figures.

IN THE DRAWINGS

Figure 2:
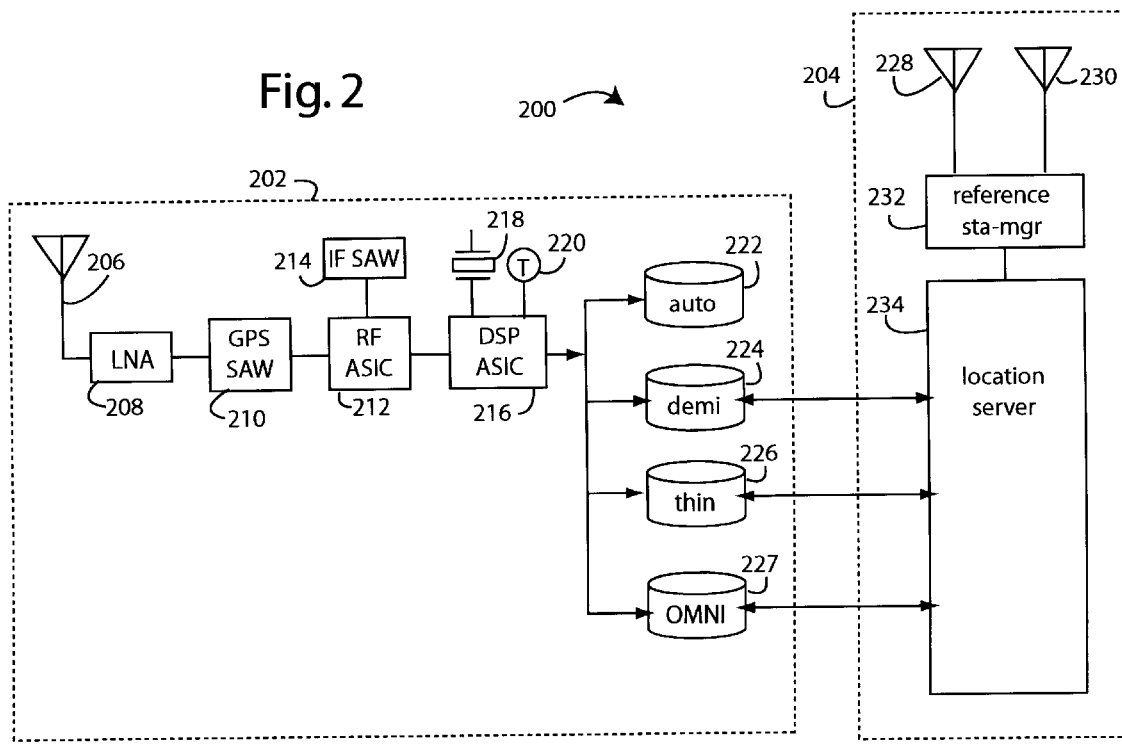

FIG. 1 is a functional block diagram of a network system embodiment of the present invention wherein a server is supporting a client with information communicated over the Internet; and FIG. 2 is a functional block diagram of a navigation platform embodiment of the present invention;

DETAILED DESCRIPTION OF THE PREFERRED EMBODIMENT

FIG. 1 illustrates a network system 100, in an embodiment of the present invention, that includes a reference-station server system 102, a GPS measurement platform 104, and an intervening computer network 106 such as the Internet. The server system 102 includes a navigation satellite receiver that has locked onto and is tracking a constellation of navigation satellite vehicles (SV's) 108, 110, and 112. Some of these may also be visible to the GPS measurement platform 104. Another constellation of navigation satellites, including 114 and 116 is visible to client system 104. The GPS measurement platform 104 includes its own navigation satellite receiver, but such may not has yet locked onto and be tracking its constellation of navigation satellites 112, 114, and 116.

In general, there are four types of GPS measurement platform embodiments of the present invention that are categorized by how independent of the server they can operate. An autonomous client can function and provide navigation solutions to a user with only minimal help from the server 106, e.g., differential correction data. A demi-client needs more help, e.g., polynomial models that simplify ephemeris and time bias calculations. A thin-client lays off just about all the navigation calculations on the server 106, and basically provides only observational measurements from its point of view of the SV constellation. The navigation solutions are returned for local display if a user is there and wants to see them.

The fourth type of client is a high-sensitivity GPS receiver connected as client 104, herein referred to as OMNI. Such fourth type is the one of interest here.

FIG. 2 represents a OMNI-client navigation satellite receiver network embodiment of the present invention, and is referred to herein by the general reference numeral 200. The OMNI-client navigation satellite receiver network includes at least one navigation platform 202 supported by a network server 204.

Each GPS measurement platform 202 typically comprises a GPS antenna 206, a low-noise amplifier (LNA) 208, a GPS surface acoustic wave (SAW) filter 210, a radio frequency (RF) application specific integrated circuit (ASIC) 212 with an intermediate frequency (IF) SAW-filter 214, a digital signal processor (DSP) 216, a reference crystal oscillator 218, and a reference-crystal temperature sensor 220.

An autonomous client 222 can function and provide navigation solutions to a user with next to no help from the server 204. A demi-client 224 needs help, e.g., polynomial models that simplify ephemeris and time bias calculations. A thin-client 226 does not burden its local host with navigation solution processing. It lays off just about all the navigation calculations on the server 204, and basically provides only observational measurements from its point of view of the SV constellation. The navigation solutions are returned for local display if a user is there and wants to see them. In a thin-client 226, the DSP is a shared part with some other non-GPS application. As such, multi-threaded application programs are not needed at the client and only simple program loops are executed.

An OMNI client 227 runs almost fully autonomously, but periodically collects a full set of ephemeredes over the computer network. It further operates during power off to keep its position uncertainty, sigmaPos, under 150-km when it is powered back up. These conditions allow high sensitivity operation where much finer search steps are used to find signal power and each step has a long dwell. The OMNI client 227 also benefits greatly if the crystal oscillator 218 is software compensated using temperature measurements by temperature sensor 220. A real time clock (RTC) is kept running that is accurate to better than one millisecond of true time each time the navigation platform 202 is powered-up.

The local reference oscillator crystal oscillator 218 will has a frequency drift error that will vary as a function of temperature. The reference-crystal temperature sensor 220 is used to measure the temperature of the local reference oscillator crystal oscillator 218. The first use is to collect data to build curve during manufacturing calibration when the navigation platform 202 is initialized and tracking SV's. The subsequent use is to provide an index value so a ninth-order polynomial equation can be computed from stored coefficients while the navigation platform 202 is initializing and trying to lock onto its first SV.

The server 204 typically comprises a number of reference station antennas 228 and 230 that provide GPS signal inputs to a reference station manager 232. A location server 234 can provide support information to the demi-client 224, thin-client 226, and OMNI-client 227 for improved time-to-first-fix and position solution quality. In the case of the OMNI-client 227 operating in high-sensitivity mode, the ephemerid information collected and forwarded by the server 204 enables anywhere fixes with signal levels from SV's under −150 dbm.

A method embodiment of the present invention determines how and when the server 204 is contacted by an OMNI client, e.g., client 104 and navigation platform 202. The server contact must be infrequent and minimized in many situations because the per-byte communication costs are high or the network is only periodically accessible.

When signal strengths are high, the z-count and BTT are really measured by collecting NAV-data. The BTT is used to clean-up any codephase roll-overs. Generally the sub-20 msec portion should agree. There is a bit more noise on the BTT than z-count. However, the z-count can be off by one millisecond for a short period of time near where the codephase rolls over.

The OMNI client needs a good time source to reduce sigmaTime to under one millisecond. The 50-Hz NAV-data can be used to do a pattern match and indirectly find time. Such can provide a GPS receiver with an adequate time source when a z-count cannot be demodulated. If there is enough confidence in the pattern match, the integer millisecond, intMs, on an SV can also be determined.

If the starting time uncertainty, sigmaTime, is greater than ±10 msec, the so-called big delta T term (DT) has to be used in the solution fix. Such increases the number of SV's needed by one. A gridFix method can be used when the position uncertainty, sigmaPos, is under 150-km and the intMs on SV's is not available. A no-Z fix type is used when sigmaTime is greater than 10 msec.

A complete GPS almanac, highAccAlm, is sent by the server with ephemeredes rather than almanacs for all GPS SV's. Another complete GPS almanac, mixAccAlm, can be sent by the server and includes older ephemeredes for SV's it is not currently tracking.

Preferably, a WWserver server is implemented that has continuous observability of the complete GPS constellation. It has enough reference stations with adequate spatial separation to view all SV's around the world at the same time. Server 204 represents a local server, LAserver, that has one or more reference stations that observe only a sub-set of the complete GPS SV-constellation. Therefore an LAserver can not provide highAccAlm, only mixAccAlm.

After turning on, the almanac will include ephemeredes that are actually almanacs. After one 12-hour cycle, some of the almanacs will be replaced with ephemeris based almanacs.

The NAV-data from the GPS SV's can be collected directly down to signal levels as low as −145 dbm. Therefore, the ephemeris, z-count and BTT can be derived at this level. SV's at this level can operate independent of the server and also can be used in a fix that has no requirement on starting position accuracy, e.g., anywhere fix. Pattern matching is necessary starting at −145 dbm and can be carried on down to ass low as −150 dbm. A z-count or intMs can be thereby obtained so the SV can be used in an anywhere fix. However at such signal levels, the ephemeris needs to be obtained over the network 106 from server 102, or their alternative source. Below signal levels of −150 dbm, the NAV-data is not reliable enough for a pattern match. The NAV-data must be obtained from the server 102 or 204, and the SV's with such weak signals can only participate in a fix when the uncertainty is less than 150-km.

During initial SV acquisition, ephemeris level accuracy is not needed. An almanac, or downgraded ephemeris, is adequate to predict the data needed for preposition. Ephemeris level accuracy is also not needed for fixing. A time-out is defined for the ephemeris age for positioning. Such threshold can be relaxed and still maintain respectable positioning if the accuracy degradation as a function of time is properly modeled. The age threshold can be a controllable parameter so that the customer can select the desired level of performance.

NAV-data subframe data from the server 102 is needed for first fix or setting time. After that, subFrames are no longer requested by client 104. The NAV-data decoded by the client 104 can be sent to the server 102 for the server to do the pattern-matching.

A server connection is not needed by OMNI client 104 when there are three or more SV's with signal levels all better than −145 dbm. The time-to-first-fix (TTFF) will be longer if the ephemeris must be collected. In some cases, previously collected ephemeredes can be used.

A server connection is not needed by OMNI client 104 when previously collected ephemeredes for SV's are on-hand and sigmapos is less than 150-km. The minimum numbers of SV's needed depends on sigmaTime. Such time uncertainty can be reduced with a real-time clock (RTC) that is software-compensated for temperature drift. So three SV's are needed with such RTC, and four SV's without the RTC Otherwise, solving for a fix will require that the OMNI client 104 contact the server 102 and request certain information. The NAV-data subframes are needed when the SV's signals are −145 dbm to −150 dbm and sigmaPos >150-km. The intMs for these SV's is needed for them to participate in the first fix. If only three −145 dbm or weaker SV's are available and no other better means of accurate time, pattern matching can be used. A so-called no-Z fix with four SV's is then used.

The ephemeris has to be requested when SV's signals are not stronger than −145 dbm and their ephemeris has timed out. In such case, the fastest TTFF possible is desired.

A main program application can periodically turn-on the GPS receiver and get a fix. Such decides how far the receiver has moved since the last fix, or decides simply if the GPS receiver has left a predefined zone. The time interval between fixes is selected to keep sigmaPos within 150-km so that the intMs is not needed on weak SV's under −145 dbm. Such extends the ability to retain high sensitivity fixes without needing a server connection to request NAV-data subFrames. The timing of the server requests is adaptive. This is needed to provide a quiet client/server connection when there is adequate performance without it.

The OMNI client must evaluate the data it has, the data's age, and the likelihood of acquisition success, e.g., number of SV's and the signal levels. The OMNI client then decides whether to make the connection and what data to request. The adaptivity can be disabled and the server connection can made by explicit commands. A master application may decide to make a server connection every one hour. Thus, for fixes done every five minutes, the twelfth one will make a server connection.

A broadcast type ephemeris service can be used where the master application collects the data and then pushes it into the client through generalized API's. The client can be empowered to make a server connection any time during a session.

The client typically has a time uncertainty larger than one millisecond before a fix. So a conventional search of the complete codephase is done prior to the first fix. After the first fix, or with some restarts using RTC, the client may have a time uncertainty under one millisecond. In these cases the client can reduce the code search window. So even if the client has time from a measured z-count, the client still has to search all 1023-chips of code uncertainty.

Critically, in all embodiments of the present invention, a portion of DSP 216 (FIG. 2) is kept alive after power-down and is maintained as the time source between client sessions. During power-down, power is actually turned off to RF ASIC 212 ASIC 212, sampleClock, sampleMem, and OSM. But the power is kept alive to the crystal oscillator 218 and a millisecond-interrupt internal to DSP 216 so it can process it.

The client 202 has the advantage of the oscillator stability in maintaining the time calculated in a last position fix for a relatively long period until the next GPS session.

The client empirically determines the accuracy that can be achieved. To do this, the client can set time from a fix, and then stop tracking for a given off time. Then the client re-enable tracking and use the measured z-count as an indication of how far the clock has moved. The clock adjustments the client perform in the fix will tell us how far the clock has moved with respect to GPS time.

This technique requires that the client maintain power to the crystal oscillator 218 and DSP 216. It requires that the client has the ability to keep power to the GPS circuits even when the device is apparently turned off.

In a typical shutdown, when all firmware state machines are idled, all intl activity should cease. The client will also disable automatic output so the into activity will also stop. At this point, there should not be even any background activity and the DSP 216 should finish its tasks and fall to halt mode. The halt mode is a special low power feature of the DSP 216 where it remains idle until there is an interrupt at which time it automatically jumps to that interrupt service routine.

When the millisecond-interrupt arrives, the DSP 216 wakes up and services it, advancing the all timers, including GPS time estimates, by one millisecond. The DSP 216 will then go back to halt mode when it exits the interrupt.

The client needs to output absolute time. So whenever the GPS-TOW (in seconds) rolls from 604799 to 0, the client should also increment a week counter. The client currently don't maintain absolute GPS week on DSP 216 so that feature must be added for the RTC mode. None of the processing on DSP 216 uses the week number however. It would only be included to provide absolute GPS time outside of DSP 216. The client will also benefit by maintaining a time-off variable that can be read by the client when it restarts.

The cycle is completed when the another client session commences. At this point, the client will request continuous time message output again and the client will be able to observe whether DSP 216 has remained on or off, and whether it has confidence in the time. Thus, the client will need to construct a bias and drift uncertainty that can be used by the client to decide how it can use the time from DSP 216.

When the client sends a time adjustment, it should also send the estimated accuracy of the time set. This accuracy is accepted by DSP 216. This accuracy will be automatically propagated inside DSP 216 according to a model of the stability of the crystal with respect to temperature. If there is more temperature change, the bias and drift uncertainty should propagated at a higher rate. However, if the temperature is constant, the uncertainty is propagated at a slower rate.

When the client is finishing a session, it will communicate to DSP 216 to disable all the GPS tracking functions. This will shut off RF ASIC 212, and disable all GPS state machines. The client can select either deep-sleep mode or RTC mode. If deep-sleep is selected, then the client turns off the crystal oscillator 218. However, if RTC mode is requested, then the client keep on the crystal.

The client can also request that DSP 216 maintains its millisecond clock. It can also decide to shut off everything, including the millisecond if it desires to produce the lowest power consumption. Most power is consumed only when transistors change state, and thus, if all circuits are of, the consumption is minimized. In deep sleep, the oscillator is also turned off when the DSP 216 detects deepSleep mode and encounters the halt command.

If the client turns off DSP 216 but requests the millisecond option, then the firmware disables all modes that is can, but keeps the millisecond and oscillator active. The client also disables the automatic output of time messages to keep DSP 216 as quiet as possible.

In embedded applications there is always the possibility that the power will be turned off without using a proper shutdown procedure. Ideally, the client would get a turn-off request from the application using the client. This starts the chain of events in the following table.

| | |
|---|---|
| The client | receives a request from host application that it wishes to turn off GPS; |
| The client | sends messages to DSP 216 to turn off all GPS tracking engines (ODSM, IDSM, TSM); |
| The client | sends the preferred shut down mode of DSP 216 and waits for acknowledgement of the action. If it wants the lowest power mode, it requests DEEP_SLEEP_MODE. If it wants the most information, it requests RTC_MODE; |
| The client | flushes all data from its serial buffers. |
| The client | finishes processing all events, and thus, the key memory elements that are battery backed become static; |
| The battery | backed data is saved; |
| The client | sends a message back to host application that it is in a safe state to shut down; and |
| The host | de-allocates the client applications. |

Such procedure is a preferred method when the shutdown occurs in a controlled way.

It is also possible that a less orderly shutdown will occur. In such case, the host application abruptly terminates the client code before it can perform its shut down procedure. E.g., the DSP 216 was not properly shutdown, or the power was removed from the system. This could would occur when someone removes the battery or the battery cannot provide enough current to maintain proper operating levels.

If the DSP 216 is still being powered, a checking logic can be included to detects if communication with the client has terminated. If so, the DSP 216 does its own power-down sequence. If the DSP 216 was simply powered down, when it turns on again it will be in its default state and not a problem. However, there is a risk that the client was writing to a section of the battery-backed file at the time and the data may be corrupted. A variable could be written to flag to indicate the DSP 216 shut down properly. If the variable is not set when the data is read at startup, then the data is considered invalid and is set explicitly to an invalid state.

During turn-on, the client application is started and tickles DSP 216 to wake it up and requests the time-status. Such tickle also immediately starts the TCO in DSP 216. When the time-status is received, the client sets its bias and drift uncertainty to unknown states if the time-status is invalid. In this way, any battery-backed data or data from the server can properly battle themselves for the smallest sigma. The GPS time will also be zero at this point until the client interrogates its other information sources.

If the time-status is valid, then the client copies the time uncertainty data and initializes its internal data structures with these data. If better data is available from other sources, then it can battle those uncertainties when that data becomes available. The client then reads the status concerning the battery backed data. It assimilates data sections that has the data validity flags set. Then the client is ready to evaluate its available information and begin requesting data from the server.

During an orderly shutdown, if RTC_MODE is selected, the time data is sent to DSP 216. It waits for acknowledgement as part of the shutdown procedure. If the time data is only sent in the shutdown procedure, a non-orderly shutdown of the client occurs where the power remains ON to DSP 216. In this case, the RTC_MODE will not be enabled, and DSP 216 continues to run. The state machines will still be running, and the time information will be lost.

A periodic handshake is preferred between the client and DSP 216. If that handshake is lost, and DSP 216 is still powered, then DSP 216 needs to put itself in a quiet state.

The client could still keep time active if the timing data can be sent periodically. However, maintenance of the timing data will be expensive computationally so the client will need orchestrate these computations to be a very low priority.

The following time and uncertainty maintenance equations can be used in designs. At some point, the client will get time information from either a position fix, a z-count, a pattern-match, or from another source such as a different real-time-clock, or from the server latency estimator. The client can generate a model of the accuracy of each data source for both bias and drift. The calculations are done meters for bias, and m/s for drift. An SCXO model used has units of m/s. In prepositioning, the client always computes in pseudorange, and pseudorange rate, and then convert to hardware units of $64^{th}$ chips and carrier NCO units. So, if the client wants to use the number directly in DSP 216, then the client will has to convert to NCO units.

$$\text{Drift}\,(m/s)/\lambda(m/\text{cycle})*\text{bits}/\text{Hz} =$$
$$\text{drift}*(1575.42\,e6/2.99792458\,e8)*2^{24}/528{,}000 = \text{drift}*166.9789113$$

$$\text{Drift NCO units (bits}/Hz) = \text{drift}(m/s)*166.9789113$$

The client should periodically send the following atomic data set:

1. The current bias ($b_{fix}$) in units of meters with an LSB of $2^{-6}$
2. The current drift ($d_{fix}$) in units of meters/sec with an LSB of $2^{-12}$
3. The bias sigma ($\sigma_{bf}$) in units of meters with an LSB of 2–6
4. The millisecond sigma ($\sigma_{millisecond}$) in units of milliseconds with an LSB of one millisecond
5. The drift sigma ($\sigma_{df}$) in units of meters/sec with an LSB of 2–12
6. The TCO measurement closest to estimate of the drift ($TCO_{fix}$) in units of counts with an LSB of
7. The msec16 that corresponds to the bias exactly and also all the other parameters For the frequency uncertainty, the client has just one parameter $\sigma_{df}$. However, for the time uncertainty, the client prefers to work with two parameters. In many cases, before the first fix, the time uncertainty is many milliseconds, so the client prefer to break the time uncertainty into two components: the part that is multiple millisecond, and the part that is sub-millisecond.

Accuracy of bias and drift from different sources

| Fix type or information source | The millisecond sigma ($\sigma_{millisecond}$) (milliseconds) | The bias sigma ($\sigma_{bf}$) (meters) | The drift sigma ($\sigma_{df}$) (m/s) |
|---|---|---|---|
| From DSP 216 RTC | Computed from data sent to DSP 216 originally | Computed from data sent to DSP 216 originally | Computed from data sent to DSP 216 originally |
| Approximate time from RTC or client device | 1000 | 300,000 | Based on SCXO availability or from battery backed drift estimate |
| Approximate time from server | 1000 | 300,000 | Based on SCXO availability or from battery backed drift estimate |
| Accurate time from server | SigmaServer (calculated in the server latency logic) Probably best case 10–20 msec. | 300,000 | Based on SCXO availability or from battery backed drift estimate |
| Time from a pattern match | 10+. (There is a small probability this time could be wrong) | 300,000 | Based on SCXO availability or from battery backed drift estimate |
| Time from a z-count | 10 | 300,000 | Based on SCXO availability or from battery backed drift estimate |
| Time from a no-z fix | >> 10. Could be as large as 500, but is a function of geometry and meas noise | TDOP * $\sigma_{measPR}$ Paradox state: bias sigma small, millisecond sigma larger | TDOP * $\sigma_{measPRR}$ With good measurement, << 10 m/s (indoor) << 1 m/s (outdoor) |
| Time from fix that solves for time error linearized around time from pattern match, or z-count, or DSP 216 RTC mode or confident server time | 0 | TDOP * $\sigma_{measPR}$ Paradox state: bias sigma small, millisecond sigma larger | TDOP * $\sigma_{measPRR}$ With good measurement, << 1 m/s (indoor) << 1 m/s (outdoor) |

The propagation equations update the drift with the TCO and previous drift, propagate the bias with the drift, do millisecond adjustments when the bias exceeds ±½ millisecond, update the drift uncertainty, and update the bias uncertainty. In order to propagate the bias and bias sigma, the client will need to update the drift and drift sigma. Fundamentally, the bias is the integral of the drift, and the bias sigma is the integral of the drift sigma.

The client estimate the drift based on the drift data at the fix and the current SCXO data based on current TCO reading.

driftHat = function (drift at fix, SCXO drift at fix, current SCXO drift)

The bias with a drift estimate is propagated. When the bias exceeds ±½ msec, the client adjusts the DSP 216 millisecond so that the millisecond stays accurate

```
Bias = bias + driftHat * dt
If (bias > millisecond/2) {
    Bias -= millisecond
    Adjust DSP 216 millisecond +1 millisecond
}
else if (bias < -millisecond/2) {
    bias += millisecond
    Adjust DSP 216 millisecond -one millisecond
}
```

The client update the drift sigma based on the drift at the fix and the current drift model based on current TCO.

driftSigma(t) = function(drift sigma at fix, SCXO sigma at fix, current SCXO sigma)

The client propagate the bias uncertainty as the integral of the drift uncertainty.

biasSigma = biasSigmaAtFix + integral ( driftSigma(t) ) * dt

When the next session begins, the client sends back the bias, drift, and sigmas. Hopefully, the bias sigma will grow to less 10 or 20 millisecond meaning the client can actually do a fix without reliance on time from any other source.

Thus, the following parameters are defined from the observations:

1. $\delta(t_{fix}) = d_{fix} - d_{SCXO}(t_{fix})$. This signed parameter is measured at fix time and represents the model error at the fix time. It remains constant until the process is re-started.
2. $\delta(t_{now}) = d_{SCXO}(t_{now}) - (t_{fix})$. This is a signed parameter and represents the change in the model from fix time.

The first goal is to propagate the bias with the best estimate of the drift. Of course the client also has the requirement that the estimated bias sigma is the least upper bound (LUB) of the true bias error. In this way, as the client propagate the bias sigma it will remains sufficiently small so that after a long period of time the sigma indicates the client can use the bias to compute a fix. Stated conversely, if the bias sigma is too large, then the client cannot confidently use the bias estimate to compute a fix.

Around the time of the fix the measured drift is certainly the best estimate the client has. As long as the temperature stays near the fix temperature then the client want to use the fix drift as the propagation source. This will also produce the smallest drift sigma, and thus, the bias sigma will integrate slowly and help produce the LUB criteria.

Conversely, when the time since the last fix is large, the client tend to lose confidence in the fix drift as a reference point and the client prefer to transition to the completely modeled data. However, the client has to use the larger sigma to propagate.

In between these two extremes, it seems logical to blend the two sources (fix and model) together. Empirically, the client has seen that it is common for the drift trajectory to be somewhat biased from the SCXO model for long periods. However, from day to day, it is equally likely that the bias is above or below the model. If the client blend the data together, and lean on the fix drift as long as possible to produce the current days bias, then the client can hopefully obtain a more accurate drift and also reflect that in a smaller drift sigma.

One key observable is $|\delta(t_{fix})|$, the difference between the measured and modeled drift at the fix time. Assume that the client will perform some integrity checking on the measurements used in the fix, and also the fix itself. For example, if the computed velocity is close to zero, this is like a stable point and it is likely that the Doppler measurement errors are small. Thus, the client will assume that the measured drift from the fix has high confidence. Degradations due to using indoor measurements will be reflecting the drift sigma from the fix. From this point of view, the client tend to has more confidence in the recent measured data.

The aging or shock of the crystal will tend to produce a bias between the crystal and the model. The client must accept there will be discrepancies between the measured and modeled data. The client will develop a methodology to propagate the bias and bias sigma with a drift and drift sigma that has a stronger weighting to the measured data but slowly converges towards the modeled drift as the time from the measurement increases.

A simple formulation is defined for migrating between the drift estimated at the fix to a drift estimate from the SCXO. The client will control the rate of the migration via a couple simple parameters.

The client will be blending two estimates of drift, one that is the SCXO model based on the current TCO, and the other is the adjusted fix drift. The adjusted fix drift is simply the drift from the fix corrected for the change in the model due from the current time and the time of the fix.

The adjusted fix drift is:

$$d_a(t_k)=d(t_{fix})+d_{SCXO}(t_k)-d_{SCXO}(t_{fix})$$

The client define the blended drift estimate as:

$$d^\wedge(t_k)=[1-\alpha]*d_a(t_k)+\alpha*d_{SCXO}(t_k)$$

Notice that the client has two estimates of drift that the client blend with the parameter $\alpha$. This parameter provides,
1. When $t_k=t_{fix}$, then the client want $d^\wedge(t_k)=d_a(t_k)$. This requires $\alpha=0$.
2. When $t_k>>t_{fix}$, then the client want $d^\wedge(t_k)=d_{SCXO}(t_k)$. This requires $\alpha=1$ Thus, defining the parameter N, the count of the times the filter has been updated,
Define:

$N_1=1$, if $k=1$ $N_k=k$ if $k<=N_{max}$ $N_k=N_{max}$ if $k>N_{max}$

The client also want to be able to perform the multiplies using integer math, thus, the client define $\alpha=N_k/2^M$ $1-\alpha=(2^M-N_k)/2^M$ $N_{max}=2^M$ The client only need specify one parameter M and then the rate of change is completely defined.

| M | $N_{max}$ = Seconds to final value | Hours to final value |
|---|---|---|
| 8 | 256 | .071 |
| 10 | 1025 | .284 |
| 12 | 4096 | 1.14 |
| 14 | 16368 | 4.55 |
| 16 | 65536 | 18.2 |

The same formulation is used for the drift sigma.

$$\sigma_d(t_k)=[1-\alpha]*\sigma_{fix}+\alpha*\sigma_{SCXO}(t_k)$$

The models are updated every second, so there is an implicit multiply by one second, the client can update the bias as follows:

$$b(t_k)=b(t_{k-1})+d^\wedge(t_k)$$

The client will also update the bias sigma as the integral of the drift sigma, so there is an implicit multiply by one second as follows:

$$\sigma_b(t_1)=\sigma_{bfix}$$

$$\sigma_b(t_k)=\sigma_b(t_{k-1})+\sigma_d(t_k)$$

The crystal oscillator 218 and DSP 216 hardware can be used to verify that accuracy of the model and also select the correct time constant. Real DSP 216 hardware tracking at least one satellite so that the client can always measure true bias and drift. The client do this by linearizing the pseudorange and pseudorange rate around the true position as follows:

a. LPR=intms*cmsec+codePhase-rangeHat-corr
b. LPRR=rangeRate-rangeRateHat
c. The model is that LPR=biasTrue and LPRR=driftTrue The very first measurement, the client set the receiver clock terms to null out LPR and LPRR. Any component of LPR larger than ±½ millisecond goes into millisecond clock adjustments. The sub-millisecond portion residual is the starting bias. After the first adjustment, the client now start to form bias and drift from the SCXO data and equations given above. If the bias grows over the ±½ msec range, the client do the clock adjustment as usual. The LPR and LPRR will provide us with the true bias and drift and the equations will provide the estimated bias and drift. Also, when ever there is measured z-count, if the client correct this with the true intms rather than assuming 70, the client will has the true millisecond time error.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the "true" spirit and scope of the invention.

What is claimed is:

1. A warm-start method for a subsequent initialization of a navigation satellite receiver, the method comprising the steps of:

maintaining sub-millisecond accurate time with a crystal oscillator;

setting said crystal oscillator to atomic-standard accuracy when a navigation platform that includes it has acquired and is tracking satellite vehicles;

measuring temperature of said crystal oscillator during periods said navigation platform is powered-off;

correcting a free running time of said crystal oscillator with data obtained in the step of measuring temperature when said navigation platform is not tracking satellite vehicles;

in a subsequent acquisition, supplying sub-millisecond accurate time to said navigation platform prior to a next fix; and skipping a fresh determination of the integer millisecond and z-count before producing a warm start Position fix.

2. The method of claim 1, further comprising the step of:

building a temperature-drift model for said crystal oscillator during periods that atomic-standard accurate time can be derived while said navigation platform has acquired and is tracking satellite vehicles.

3. The method of claim 1, wherein: the step of maintaining comprises keeping a real time clock portion of a digital signal processor alive during a general power down.

4. The method of claim 1, wherein: the step of maintaining comprises processing millisecond interrupts with a portion of a digital signal processor kept alive during a general power down.

* * * * *